United States Patent
Choi et al.

[11] Patent Number: 5,866,476
[45] Date of Patent: Feb. 2, 1999

[54] METHODS FOR FORMING MOISTURE BLOCKING LAYERS

[75] Inventors: Ji-hyun Choi, Seoul; Hae-Jeong Lee, Kyungki-do; Byung-Keun Hwang, Kyungki-do; Ju-Son Gou, Kyungki-do, all of Rep. of Korea

[73] Assignee: Samsung Electronics Co., Ltd., Kyungki-do, Rep. of Korea

[21] Appl. No.: 826,483

[22] Filed: Mar. 27, 1997

[30] Foreign Application Priority Data

Mar. 30, 1996 [KR] Rep. of Korea .................. 96-9578

[51] Int. Cl.⁶ .................................................. H01L 71/316
[52] U.S. Cl. ........................................... 438/624; 433/763
[58] Field of Search .................................. 438/624–637, 438/622, 640, 699, 763–782, 795, 781, 906, 908, 631

[56] References Cited

U.S. PATENT DOCUMENTS

| | | | |
|---|---|---|---|
| 5,003,062 | 3/1991 | Yen | 437/231 |
| 5,192,697 | 3/1993 | Leong | 437/37 |
| 5,270,259 | 12/1993 | Ito et al. | 438/623 |
| 5,286,681 | 2/1994 | Maeda et al. | 438/760 |
| 5,290,399 | 3/1994 | Reinhardt | 156/655 |
| 5,376,590 | 12/1994 | Machida et al. | 437/235 |
| 5,429,990 | 7/1995 | Liu et al. | 437/190 |
| 5,432,073 | 7/1995 | Wu et al. | 437/195 |
| 5,457,073 | 10/1995 | Ouellet | 437/231 |
| 5,496,776 | 3/1996 | Chien et al. | 437/231 |
| 5,506,177 | 4/1996 | Kishimoto et al. | 438/624 |
| 5,663,108 | 9/1997 | Lin | 438/624 |

*Primary Examiner*—Charles Bowers
*Assistant Examiner*—Matthew Whipple
*Attorney, Agent, or Firm*—Myers Bigel Sibley & Sajovec

[57] ABSTRACT

A method for forming an insulating layer for a microelectronic device includes the steps of forming a conductive pattern on a surface of a microelectronic substrate, and forming a spin-on-glass layer on the surface of the microelectronic substrate covering the conductive pattern. The spin-on-glass layer is baked at a temperature in the range of 400° C. to 750° C., and a moisture blocking layer is formed on the baked spin-on-glass layer. By reducing moisture absorbed from the air into the spin-on-glass layer, a relatively low etch rate and a relatively low dielectric constant can be maintained for the spin-on-glass layer. Related structures are also discussed.

23 Claims, 2 Drawing Sheets

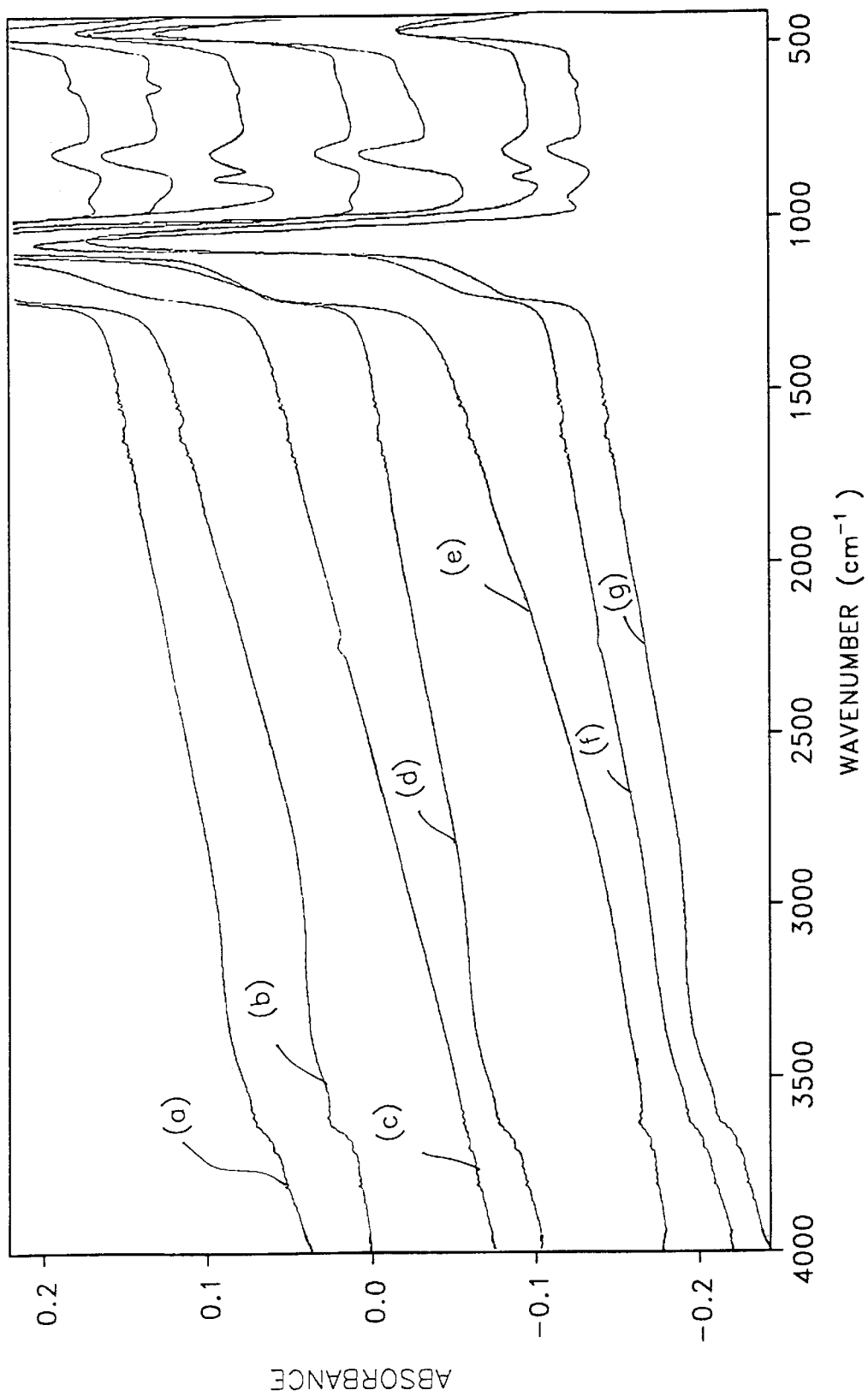

METHODS FOR FORMING MOISTURE BLOCKING LAYERS

FIELD OF THE INVENTION

The present invention relates to the field of microelectronics, and more particularly to methods for forming insulating layers for microelectronic devices and related structures.

BACKGROUND OF THE INVENTION

A microelectronic device may include electrical interconnections for transferring electrical signals. These interconnections are typically formed by patterning conductive layers, and these interconnections may influence the operating speed of the microelectronic device. Multi-layered interconnection technologies have thus been developed to reduce the length of interconnections to thereby improve operating speeds of microelectronic devices. The multi-layered interconnection technologies can also reduce the size of a microelectronic device thus facilitating higher levels of device integration.

In particular, multi-layered interconnections can be provided by forming an interlayer insulating layer between upper and lower interconnections. The interlayer insulating layer is preferably planarized at a low temperature so that the characteristics of electronic devices such as transistors are not significantly changed. The interlayer insulating layer is also preferably formed of a material having a relatively low dielectric constant to reduce parasitic capacitances between adjacent interconnections.

Spin-on-glass layers have been used to provide interlayer insulating layers which can be planarized at relatively low temperatures and provide relatively low dielectric constants. A spin-on-glass interlayer insulating layer can be formed by coating a liquid spin-on-glass based material on the microelectronic device including the lower interconnection and hardening a spin-on-glass layer by baking it at a predetermined temperature. Contact holes can be formed in the interlayer insulating layer exposing portions of the lower interconnections. The upper interconnections can be formed on the interlayer insulating layer with contact to the lower interconnections provided through the contact holes.

A spin-on-glass layer, however, may exhibit a relatively strong hygroscopicity. In other words, a spin-on-glass layer may absorb moisture. If moisture is absorbed into the spin-on-glass layer, a wet-etch rate of the spin-on-glass layer may increase, and the dielectric constant may also increase. Accordingly, a wet-etch used to remove a natural oxide on portions of the lower interconnection exposed by the contact holes may have an increased etch rate due to the absorption of moisture. Accordingly, the spin-on-glass interlayer insulating layer may be undesirably etched when removing the natural oxide from the lower interconnection so that the size of the contact hole is undesirably increased. In addition, parasitic capacitances between adjacent interconnections may increase if moisture is absorbed by the spin-on-glass interlayer insulating layer. An operating speed of the microelectronic device may thus decrease due to the increased parasitic capacitances.

A quantity of moisture absorbed by a spin-on-glass interlayer insulating layer can be reduced by thermally treating the spin-on-glass layer at a temperature greater than 800° C. A thermal treatment at a temperature greater than 800° C., however, may change the characteristics of transistors formed under the spin-on-glass layer. In particular, this thermal treatment may reduce channel lengths as a result of re-diffusion of dopants in the source/drain and channel regions thus altering the dopant concentrations of the transistor channel regions. Accordingly, there continues to exist a need in the art for improved interlayer insulating layers and methods for forming microelectronic devices.

SUMMARY OF THE INVENTION

It is therefore an object of the present invention to provide improved methods for forming interlayer insulating layers and related structures.

It is another object of the present invention to provide methods for reducing the absorption of moisture into interlayer insulating layers and related structures.

It is still another object of the present invention to provide methods for forming interlayer insulating layers with a reduced dielectric constant and related structures.

These and other objects are provided according to the present invention by methods which include the steps of forming a conductive pattern on a surface of a microelectronic substrate, and forming a spin-on-glass layer on the surface of the microelectronic substrate covering the conductive pattern. The spin-on-glass layer is baked at a temperature in the range of 400° C. to 750° C., and a moisture blocking layer is formed on the baked spin-on-glass layer. Accordingly, moisture absorbed from the air into the spin-on-glass layer can be reduced by the moisture blocking layer. A relatively low dielectric constant of the spin-on-glass layer can thus be maintained as can a lower etch rate for the spin-on-glass layer.

In addition, a contact hole can be formed in the moisture blocking layer and the spin-on-glass layer exposing a portion of the conductive pattern, and a second conductive pattern can be formed on the moisture blocking layer wherein the second conductive pattern fills the contact hole. Accordingly, an electrical connection can be provided between the first and second conductive patterns. By maintaining a relatively low dielectric constant for the spin-on-glass layer, parasitic capacitances between the conductive patterns can be reduced and a relatively high operating speed for the microelectronic device can be maintained.

The method can also include the step of annealing the spin-on-glass and the moisture blocking layer at a temperature in the range of 550° C. to 750° C., and the spin-on-glass layer can be formed from a material such as silicate, siloxane, or hydrogen silsesquioxane. The step of forming the spin-on-glass layer can be followed by the step of hardening the spin-on-glass layer. The spin-on-glass layer can be hardened using an oxygen plasma step or an ion implant step. The step of forming the moisture blocking layer can include forming an oxide layer on the spin-on-glass layer using chemical vapor deposition. In particular, the step of forming the spin-on-glass layer can include forming a layer of hydrogen silsesquioxane, and the step of forming the moisture blocking layer can include forming an oxide layer on the spin-on-glass layer by chemical vapor deposition.

According to an alternate aspect of the present invention, a microelectronic device includes a microelectronic substrate having a surface, and an insulating layer on the surface of the microelectronic substrate. A moisture blocking layer is provided on the insulating layer opposite the substrate, and the moisture blocking layer and insulating layer define a contact hole therein. In addition, a layer of a conductive material is provided on the moisture blocking layer opposite the insulating layer wherein the conductive material fills the contact hole. As discussed above, the moisture blocking layer reduces the absorption of moisture into the spin-on-glass layer.

According to the methods and devices of the present invention, the absorption of moisture into an interlayer insulating layer can be reduced. A relatively low dielectric constant of the interlayer insulating layer can thus be maintained.

BRIEF DESCRIPTION OF THE DRAWINGS

FIG. 4 is a graph illustrating the performance of an interlayer insulating layer formed according to the present invention.

DETAILED DESCRIPTION

Figure 1:
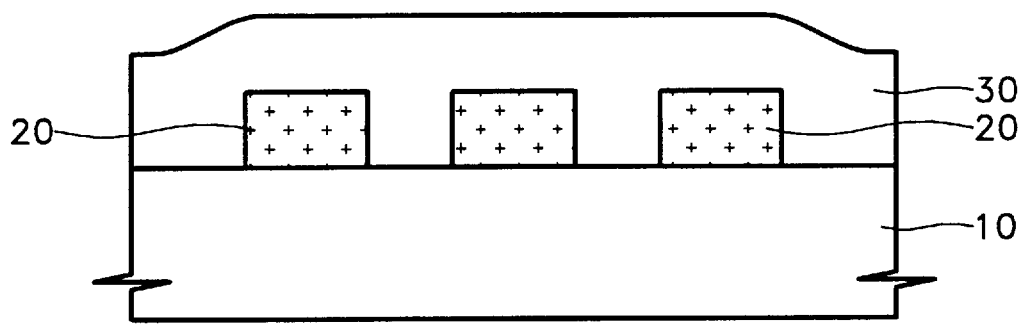
FIGS. 1–3 are cross-sectional views illustrating steps of a method for forming an interlayer insulating layer according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

A method for forming an interlayer insulating layer according to the present invention will now be discussed with reference to FIGS. 1–3. As shown in FIG. 1, a conductive pattern 20 is formed on a semiconductor substrate 10, and a spin-on-glass (SOG) layer 30 is formed on the substrate 10 covering the conductive pattern 20. The conductive pattern 20 can be used to provide a lower interconnection, or a portion of a transistor or a capacitor. The spin-on-glass layer 30 can be used to provide an interlayer insulating layer, and the spin-on-glass layer may have relatively high crack resistance. In particular, the spin-on-glass layer 30 can be formed by rotating a semiconductor wafer comprising a plurality of substrates at a predetermined speed after a liquid spin-on-glass material is coated on the wafer. The spin-on-glass material may be either an organic or an inorganic spin-on-glass based material. For example, silicate, siloxane, or hydrogen silsesquioxane may be used.

In addition, an oxide layer may be formed on the substrate 10 and conductive pattern 20 prior to forming the spin-on-glass layer 30 using a chemical vapor deposition (CVD) technique. The spin-on-glass layer may also be hardened to reduce the generation of cracks in the spin-on-glass layer and to densify the spin-on-glass layer. In particular, the spin-on-glass layer 30 can be hardened by performing an oxygen ($O_2$) plasma processing step or implanting the spin-on-glass layer with ions such as argon (Ar) ions. The spin-on-glass layer 30 can then be baked at a temperature in the range of 400° C. to 750° C. for approximately 30 minutes. The spin-on-glass layer may preferably be baked at approximately 400° C.

Figure 2:
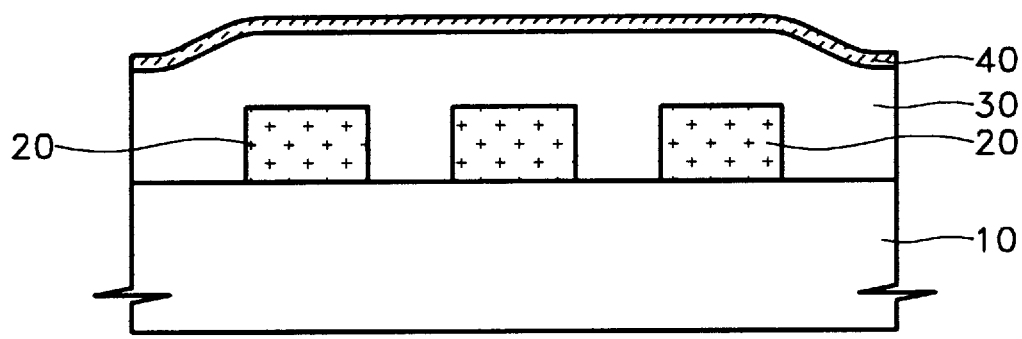

A moisture blocking layer 40 is formed on the spin-on-glass layer 30 as shown in FIG. 2. The moisture blocking layer 40 reduces the absorption of moisture from the air into the spin-on-glass layer 30 to improve stabilization and densification of the spin-on-glass layer 30. The moisture blocking layer 40 can be an oxide layer formed by a chemical vapor deposition technique such as plasma enhanced chemical vapor deposition (PECVD), atmospheric-pressure chemical vapor deposition, or low pressure chemical vapor deposition (LPCVD) at a temperature in the range of 200° C. to 750° C. The spin-on-glass layer 30 can then be annealed at a temperature in the range of 550° C. to 750° C. for approximately 30 minutes to further densify the spin-on-glass layer 30. The annealing step is preferably performed at a temperature of approximately 700° C. If the moisture blocking layer 40 is formed at a temperature above approximately 600° C., a separate annealing step can be omitted. The thus formed spin-on-glass layer 30 and moisture blocking layer 40 can together provide an interlayer insulating layer according to the present invention.

Figure 3:
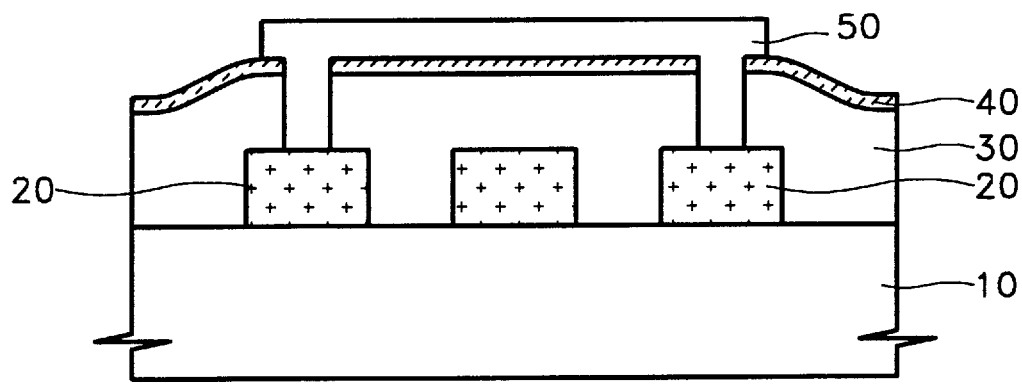

Contact holes exposing portions of the first conductive pattern 20 can be formed in the spin-on-glass layer 30 and the moisture blocking layer 40 as shown in FIG. 3. A second conductive pattern 50 can be formed to provide an upper interconnection on the moisture blocking layer 40 opposite a lower interconnection. In particular, the conductive pattern fills the contact holes so that electrical connections are provided between the upper and lower conductive patterns.

To evaluate the method discussed above, samples were manufactured by forming a spin-on-glass layer on a substrate using an inorganic spin-on-glass based material. In particular, hydrogen silsesquioxane was used, and after formation, the spin-on-glass layer was baked. The baked spin-on-glass samples were then separately processed and exposed to the atmosphere for five days. The absorbance of materials in the spin-on-glass layers was then measured using an IR spectrum and FTIR analysis. The results of this analysis are illustrated in FIG. 4.

In FIG. 4, sample (a) includes a moisture blocking layer formed by performing an oxygen ($O_2$) plasma process after annealing the spin-on-glass layer at a temperature of approximately 700° C. for approximately 30 minutes. Sample (b) includes a moisture blocking layer formed by plasma enhanced chemical vapor deposition after annealing the sample at a temperature of approximately 700° C. for approximately 30 minutes. Sample (c) includes a moisture blocking layer formed by plasma enhanced chemical vapor deposition wherein the spin-on-glass layer is annealed at a temperature of approximately 700° C. for approximately 30 minutes after forming the moisture blocking layer.

Sample (d) was prepared for the purpose of comparison. Sample (d) includes a spin-on-glass layer without a moisture blocking layer, and the spin-on-glass layer was annealed at a temperature of approximately 700° C. for approximately 30 minutes. Sample (e) was prepared by performing an $O_3$-TEOS (tetra-ethyl-orthosilicate) step in place of an $O_2$ plasma step. Sample (f) was prepared by performing an $NH_3$ plasma step and then annealing at a temperature of approximately 700° C. for approximately 30 minutes. Sample (g) was prepared by annealing at a temperature of approximately 700° C. for approximately 30 minutes and then performing an $NH_3$ plasma step.

In FIG. 4, peaks formed at wavenumber regions around 3600 $cm^{-1}$ and 940 $cm^{-1}$ indicate detection of Si-OH. The broad peaks at wavenumber regions around 3100 $cm^{-1}$ to 3600 $cm^{-1}$ indicate the presence of $H_2O$ absorption into the spin-on-glass layer. The peaks at wavenumber regions around 870 $cm^{-1}$ indicate the presence of Si-O. From FIG. 4, it can be seen that the hygroscopicity of a spin-on-glass layer can be reduced by forming a moisture blocking layer on a hydrogen silsesquioxane layer. In particular, no significant Si-OH peak is observed at wavenumber regions around 3200 $cm^{-1}$ to 3500 $cm^{-1}$ and 940 $cm^{-1}$ for sample (c) wherein a moisture blocking layer is formed on the spinon-glass layer using plasma enhanced chemical vapor deposition and then annealed at a temperature of approximately 700° C. for approximately 30 minutes. Of the samples prepared, a moisture blocking layer formed by plasma enhanced chemical vapor deposition on a hydrogen silsesquioxane layer is most moisture resistant.

According to the present invention, the hygroscopicity of a spin-on-glass layer can be reduced by thermal treatment at a relatively low temperature after a moisture blocking layer has been formed thereon. The spin-on-glass layer and the moisture blocking layer thus provide an interlayer insulating layer between interconnections of a microelectronic device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming an insulating layer for a microelectronic device, said method comprising the steps of:

forming a conductive pattern on a surface of a microelectronic substrate;

forming a spin-on-glass layer on said surface of said microelectronic substrate covering said conductive pattern;

baking said spin-on-glass layer at a temperature in the range of 400° C. to 750° C.

forming a moisture blocking layer on said baked spin-on-glass layer; and annealing said spin-on-glass layer and said moisture blocking layer at a temperature in the range of approximately 700° C. to 750° C.

2. A method according to claim 1 wherein said spin-on-glass layer is formed from a material chosen from the group consisting of silicate, siloxane, and hydrogen silsesquioxane.

3. A method according to claim 1 wherein the step of forming said spin-on-glass layer is followed by the step of hardening said spin-on-glass layer.

4. A method according to claim 3 wherein the hardening step comprises exposing said spin-on-glass layer to an $O_2$ plasma.

5. A method according to claim 3 wherein the hardening step comprises implanting ions into said spin-on-glass layer.

6. A method according to claim 5 wherein said implanting step comprises implanting argon (Ar) ions into said spin-on-glass layer.

7. A method according to claim 1 wherein the step of forming said moisture blocking layer comprises forming an oxide layer on said spin-on-glass layer by chemical vapor deposition.

8. A method according to claim 7 wherein said chemical vapor deposition is chosen from the group consisting of plasma-enhanced chemical vapor deposition, atmospheric-pressure chemical vapor deposition, or low-pressure chemical vapor deposition.

9. A method according to claim 1 wherein said step of forming said spin-on-glass layer is preceded by the step of forming an oxide layer on said conductive pattern by chemical vapor deposition.

10. A method according to claim 1 wherein said step of forming said spin-on-glass layer comprises forming a layer of hydrogen silsesquioxane, and wherein said step of forming said moisture blocking layer comprises forming an oxide layer on said spin-on-glass layer by chemical vapor deposition.

11. A method according to claim 1 wherein said annealing step is performed at a temperature of approximately 700° C.

12. A method for forming an insulating layer for a microelectronic device, said method comprising the steps of:

forming an insulating layer on a surface of a microelectronic substrate wherein said insulating layer comprises a first material wherein said step of forming said insulating layer comprises forming a layer of a spin-on-glass on said surface of said microelectronic substrate;

forming a moisture blocking layer on said insulating layer opposite said substrate wherein said moisture blocking layer comprises a second material different than said first material;

forming a contact hole in said moisture blocking layer and said insulating layer; and forming a conductive interconnection on said moisture blocking layer opposite said insulating layer wherein said conductive interconnection fills said contact hole;

wherein said step of forming said contact hole is preceded by a separate step of annealing said insulating layer and said moisture blocking layer at a temperature in the range of 550° C. to 750° C.

13. A method according to claim 12 wherein said step of forming said insulating layer is preceded by the step of forming a conductive pattern on said substrate and wherein said contact hole exposes said conductive pattern so that said conductive material contacts said conductive pattern.

14. A method according to claim 12 wherein said spin-on-glass layer is formed from a material chosen from the group consisting of silicate, siloxane, and hydrogen silsesquioxane.

15. A method according to claim 12 further comprising the step of hardening said spin-on-glass layer.

16. A method according to claim 15 wherein said hardening step comprises exposing said spin-on-glass layer to an $O_2$ plasma.

17. A method according to claim 15 wherein said hardening step comprises implanting ions into said spin-on-glass layer.

18. A method according to claim 17 wherein said step of implanting ions comprises implanting argon (Ar) ions.

19. A method according to claim 12 wherein said step of forming said moisture blocking layer is preceded by the step of baking said insulating layer at a temperature in the range of 400° C. to 750° C.

20. A method according to claim 12 wherein said step of forming said moisture blocking layer comprises forming an oxide layer on said insulating layer by chemical vapor deposition.

21. A method according to claim 12 wherein said step of forming said insulating layer comprises forming a layer of hydrogen silsesquioxane, wherein said step of forming said moisture blocking layer comprises forming an oxide layer on said hydrogen silsesquioxane layer by chemical vapor deposition.

22. A method according to claim 12 wherein said step of forming said conductive interconnection is followed by the step of:

forming a passivation layer on said moisture blocking layer and on said conductive interconnection.

23. A method according to claim 12 wherein said annealing step if performed at a temperature of approximately 700° C.

* * * * *